United States Patent
Ehrhart et al.

(10) Patent No.: US 6,472,966 B1
(45) Date of Patent: Oct. 29, 2002

(54) SUPERCONDUCTING HEAVY-CURRENT DISCONNECTOR

(75) Inventors: Peter Ehrhart, München (DE); Anton Muller, Tutzing (DE); Hermann Scholderle, Wolfratshausen (DE); Evi Sturm, Tutzing (DE); Werner Weck, Starnberg (DE)

(73) Assignee: Magnet-Motor Gesellschaft fur magnetmotorische Technik mbH, Starnberg (DE)

( * ) Notice: Subject to any disclaimer, the term of this patent is extended or adjusted under 35 U.S.C. 154(b) by 0 days.

(21) Appl. No.: 09/423,880

(22) PCT Filed: May 15, 1998

(86) PCT No.: PCT/EP98/02873

§ 371 (c)(1),
(2), (4) Date: Mar. 6, 2000

(87) PCT Pub. No.: WO98/52236

PCT Pub. Date: Nov. 19, 1998

(30) Foreign Application Priority Data

May 15, 1997 (DE) .......................... 197 20 397

(51) Int. Cl.$^7$ ................................ H01F 5/00
(52) U.S. Cl. ...................... 335/216; 324/318
(58) Field of Search .......... 335/216, 299–301; 361/19; 324/318–321

(56) References Cited

U.S. PATENT DOCUMENTS

| | | | |
|---|---|---|---|
| 3,359,394 A | | 12/1967 | Mains |
| 3,569,883 A | * | 3/1971 | Van Nice .................. 336/69 |
| 4,270,112 A | * | 5/1981 | Schneider-muntau et al. ... 336/200 |
| 5,426,408 A | * | 6/1995 | Jones et al. .................. 505/211 |
| 5,659,277 A | * | 8/1997 | Joshi et al. .................. 335/216 |
| 6,037,850 A | * | 3/2000 | Honmei et al. ............. 335/216 |
| 6,317,303 B1 | * | 11/2001 | Zeigler et al. ............... 361/19 |

FOREIGN PATENT DOCUMENTS

| EP | 0454589 A2 | | 10/1991 |
|---|---|---|---|
| JP | 4-186806 | * | 7/1992 |

\* cited by examiner

*Primary Examiner*—Lincoln Donovan
(74) *Attorney, Agent, or Firm*—Venable; Norman N. Kunitz

(57) ABSTRACT

For obtaining a compact superconductive power switch for rapid switching speeds and with high dielectric strength, several winding layers (10*a* . . . 10*h*) with several windings each are lined up adjacent each other in axial direction. Between individual layers (10*a* . . . 10*h*), there are provided cooling/heating elements (8*a* to 8*d*) in order to transfer the high-current switch unit (1) to the superconducting state and the normally conducting state, respectively, by cooling/heating, i.e. for closing and opening said unit, respectively. Mutually adjacent current conductors have the switching current flowing therethrough in opposite directions, so that the high-current switch unit (1) is of low induction, which permits fast switching times in particular when the switch is opened by an additional current pulse. Due to the numerous windings of the current conductor sections in each layer and the plurality of layers in axial directions, only a low voltage differential results between the adjacent current conductors, and an assembly with high dielectric strength is obtained in total.

26 Claims, 4 Drawing Sheets

# SUPERCONDUCTING HEAVY-CURRENT DISCONNECTOR

FIELD OF THE INVENTION

The invention relates to a superconductive high-current switch.

BACKGROUND OF THE INVENTION

Switches usable for switching high power, are, as a rule, of a complicated construction as specific measures need to be taken to counteract the formation of electric arcs and to eliminate arcs formed, respectively. A useful quantity for assessing a power switch is the switching capacity related to a unit of volume (current * voltage/component volume). With the conventional switches, this value is relatively small, due to construction expenditures.

What is disadvantageous in the conventional high-current switches is, furthermore, the relatively long switching time that usually is indicated for a complete switching cycle consisting of activation and deactivation of an electric circuit.

For solving the problems indicated hereinbefore, the applicant has already suggested a superconductive high-current switch (WO89/05044) in which plate-shaped insulating carriers having a high-temperature superconductive material vapor-deposited therein are arranged in a housing in stacked manner.

High-temperature superconductors are in particular such conductors having a transition temperature of more than approx. 80° K. Typical high-temperature superconductive materials are $ABa_3CuO_7$ (wherein A=Y, La, Nd, Sm, Eu, Gd, Ho, Xr, Lu) as well as $Y_{1.2}Ba_{0.8}CuO_4$.

The switch function of a superconductive high-current switch consists in the transition between the superconducting and normally conducting state, and vice versa. In the superconducting state, the switch is closed, i.e. current flows without electric resistance through the switch unit. By suitable cooling of the switch, the latter is brought to the superconducting state. For opening the switch, there are various mechanisms possible, for example heating of the superconductive material by electrical heating, by laser beam etc. Further possibilities are the application of external magnetic fields and the introduction of an additional current phase. As regards to further details, reference is made to the above indicated WO publication.

In the normally conducting state of the superconductive material, a considerable electrical resistance is present between the input terminal and the output terminal of the switch. Due to the construction of the known superconductive high-current switch, the dielectric strength is relatively low. In addition, to the material data of the superconductor in the normally conducting and superconducting states, the dielectric strength of the assembly determines the attainable switching capacity. Consequently, the low dielectric strength of course means a relatively low upper limit for the switching capacity.

SUMMARY OF THE INVENTION

It is the object of the invention to provide a superconductive high-current switch which distinguishes itself by a relatively high dielectric strength along with a high switching capacity per component unit of volume. In particular, a switch is to be provided for high powers, having switching capacities of preferably more than 1 MVA, in particular more than 1 GVA. particular, a switch is to be provided for high powers, having switching capacities of preferably more than 1 MVA, in particular more than 1 GVA.

With a superconductive high-current switch, this object is met according to the invention by the following features:

a) there is provided at least one layer having a winding of a superconductive, in particular high-temperature superconductive, current conductor section so as to form a high-current switch unit;

b) within each winding layer, the line routing is such that the current to be switched flows in opposite directions in radially adjacent current conductor sections; and c) there is provided a switching control means capable of effecting in the current conductor section a change between the conditions "superconducting" and "not superconducting".

In the superconductive high-current switch according to the invention, the switching control means actively brings the current conductor sections—at least in part—from the state present at the particular moment (superconducting/normally conducting) to the other state (normally conducting/superconducting) in order to thus "open" and "close" the switch, respectively. The current conductor section in the winding layer—electrically constitutes a continuous current conductor between an input terminal and an output terminal of the switch. As will still be elucidated in more detail further below, a specific embodiment of the invention is provided with a single, continuous current conductor, e.g. in the form of a pre-insulated wire. In a preferred embodiment, several layers with one winding means each are lined up adjacent each other in the direction of the winding axis. What is essential in this respect is that the voltage present between switch input and output is distributed to several layers in axial direction of the assembly. Due to this, the voltage to be switched is distributed to several layers so that very high dielectric strength is obtained. In the superconducting state, there are considerable currents flowing. By means of the switch according to the invention, it is thus possible to obtain high switching capacities. All embodiments of the invention distinguish themselves by a relatively simple, but definitely very compact construction, so that the electric switching capacity related to the unit of volume of the switch is considerable, which makes the switch according to the invention superior as compared to conventional switches.

An additional specific feature of a power switch is the switching speed. According to the invention, the current direction within each layer in the individual current conductor sections extends such that the current flow direction is opposite in adjacent current conductors. Due to the fact that each winding means of a conductor naturally has a certain inductance, the switching operation in a switch is impaired by the energy stored in the inductance. Due to the opposite current flow direction according to the invention, a low-inductance construction is obtained, so that the switching speed is thus high.

In a specific embodiment of the invention, the individual lined-up layers of the high-current switch according to the invention have the same or at least a similar structure, in particular with current conductor sections adjacent in axial direction having virtually the same radial. distance from the winding axis. In such axially adjacent current conductors of adjacent layers, the current flow directions in a less expedient embodiment may be in the same direction, but preferably the current flow directions. are also opposite in the axially adjacent current conductor sections as well. When the current flow directions are opposite not only in radially adjacent but also in axially adjacent current conductor sections, the particularly, advantageous properties of the high-current switch according to the invention, as elucidated hereinbefore specifically for one winding layer each, are still enhanced. This holds in particular for the inner mechanical forces between the current-conducting parts, which remain very low despite the compact construction and thus permit the conduction of higher currents.

The effects and advantages of the invention elucidated in the following concern various embodiments relating to the design of the current conductor sections, the layer structure, the entire structure of the switch with its specific electrical and mechanical features and the construction and operation of the switch in consideration of the superconductivity of the current conductor material.

In order to effectively exploit the high dielectric strength, the high switching capacity and the high switching speed, there should be provided a minimum number of layers, which possibly should be an even number of layers for reasons of symmetry. Preferred are at least four layers.

Superconductors are available in the market in various embodiments, e.g. as pre-insulated wire. In a preferred embodiment of the invention, all current conductor sections are formed of windable wire, preferably the entire switch construction consisting of one continuous windable wire, with the winding in the individual layers and the relation of the windings in adjacent layers being selected such that the above-elucidated opposite current flow direction in adjacent current conductor sections is achieved. The specific winding geometry will still be dealt with further below.

The windable wire may consist of filament wire with a resistance matrix. In such a wire, numerous very thin filaments are embedded in the matrix of resistance material. An alternative to the windable wire is a cable formed of filament wires, e.g. a braided cable. With such a windable wire, relatively narrow bending radii can be realized, without the wire being damaged in the winding operation. The intact, wound wire may carry the full nominal current so that the switch constituted by the wire does not have resistance in the closed state.

The current conductor sections may also consist directly of high-temperature superconductive material.

In particular, it is preferred to implement the entire switch construction of one continuous wire. In this case, no additional length will be required for soldering the sections.

For obtaining a good ratio of electric switching capacity and unit, of volume of the switch, it is advantageous to keep the total volume to be provided for insulation and mechanical stabilization of the switch very low. A practical possibility to obtain this effect consists in directly winding pre-insulated current conductors, dispensing with any structure material. With this embodiment, the merely pre-insulated current conductors are wound into the desired shape without requiring additional specific insulating measures between the individual windings. The desired dielectric strength is achieved by a correspondingly high number of layers and a corresponding length of the switch, respectively, so that the pre-insulation is. sufficient to prevent voltage breakdowns. In a specific embodiment, the dielectric strength is obtained by subsequent impregnation with an insulation casting compound, e.g. epoxy resin. This process can be carried out in layer-wise manner or on the complete unit. It is possible to provide the individual wound layers of pre-insulated wire with an insulation layer in layer-wise manner, so that enhanced insulation is obtained between the layers, in order to comply with the voltage between two axially adjacent current conductor sections which is somewhat higher than the voltage between two radially adjacent current conductor sections.

Preferably the entire constructional unit of the high-current switch is provided with an insulation layer which, in a specific embodiment, also serves as a mechanical stabilization.

Instead of winding only pre-insulated conductors in a radial direction in order to obtain the individual layers, it is also possible to make use of current conductor sections having a sheathing material. The sheathing material of the current conductor sections servesas insulation both between radially and between axially adjacent current conductors. The criterion for designing the dielectric strength of the sheathing material then is the highest voltage occurring between two layers. It is preferred to fill the entire high-current switch with suitable casting material and to obtain mechanical stabilization of the unit with the aid of this casting compound. The specific embodiments of the invention elucidated hereinbefore relate to the use of a windable wire. As an alternative, it is however also possible to use a structure material which predetermines the subsequent shape of the winding, by introducing the windings into the structure material. The structure material may be, e.g., an insulating material body having openings in accordance with the subsequent windings. When such a structure material is used, a specific embodiment of the invention provides that ceramic high-temperature superconductive material is filled as a preliminary product into the openings of the structure material, whereupon the superconductive material is suitably heat-treated, e.g. sintered or textured, in the molten form. The superconductive material can also be applied in thin layers by vapor deposition.

The structure material can not only be used with superconductive material to be heat-treated, but also with windable wires. In any case the structure material may serve as insulating material and also as material for mechanical stabilization of the component. While the afore-mentioned features of the high-current switch according to the invention relate specifically to the design of the current-conducting windings proper, the following discussion shall deal in more detail with the means through which the windings are transferred from the superconducting state to the normally conducting state—and vice versa.

For transferring from the superconducting to the normally conducting state, preferably an integrated heating means is employed that is arranged between axially adjacent layers. A heating means may be integrated between each adjacent layer, but it is also possible to integrate heating means between every two or three or. more layers that are combined as a block.

When the high-current switch according to the invention is closed, i.e. when the current-conductor sections are in the superconducting state, all current-conductor sections are cooled to such an extent that they conduct current without resistance below the transition temperature. For opening the switch, it is possible to activate e.g. the above-described heating means so that the temperature at least of individual portions of the current conductor sections increases beyond the transition temperature. The state of superconductivity thus breaks down in the portions of increased temperature. It is possible to design the heating means such that virtually all current conductor sections change to the non-conducting state everywhere at the same time. In a preferred embodiment of the invention, however, it is sufficient if a temperature increase takes place only partially. Upon transition to the normally conducting state, the respective current conductor sections generate sufficient dissipation heat for heating the so far not yet normally conducting, adjacent current conductor sections to such an extent that the temperature thereof increases beyond the transition temperature. This transition takes place relatively rapidly, so that the entire current conductor length has a very high electric resistance within a short period of time, which corresponds to the opened state of the switch.

For transferring the high-current switch from the normally conducting to the superconducting state, the current conductor sections must be cooled down to such an extent that the temperature thereof is below the transition temperature. This takes place normally by the cryogenic cooling medium necessary for obtaining superconductivity. In particularly preferred manner—similar to the heating means elucidated hereinbefore—cooling means are provided between the individual layers of the switch. In a specific embodiment, thermoelectric power elements are arranged between the individual layers of the switch, such as e.g. specific Peltier elements capable of operating at the low temperatures typical for superconductors. These thermoelectric power elements can be operated both as heating means and as cooling means, as known in principle from the prior art.

In a further embodiment of the invention, an externally generated magnetic field and/or a short, high additional current pulse passed through the winding serves for transfer from the superconducting to the normally conducting state. This additional current pulse has a duration of less than 10 $\mu$s. It may also be generated by short-circuiting the load. Triggering by an additional current pulse is particularly advantageous if the deactivation operation is to be extremely fast and the voltage drop is to be formed immediately over the entire conductor length.

The above-described mechanism of exploitation of the self-heating effect can be used here as well.

Depending on the particular application, it may be desired that the current flowing through the load to be switched is limited in its amount. In such a specific case, a particular embodiment of the invention may be designed such that, when a threshold value of the rising current is exceeded, this causes a spontaneous transition of the current conductor sections from the superconducting to the normally conducting state. When sufficient cooling of the superconducting material is reached again thereafter (e.g. by continuously activated cooling means), the superconducting state is resumed, so that an in total periodic activation and deactivation can be realized by the high-current switch according to the invention.

BRIEF DESCRIPTION OF THE DRAWINGS

For obtaining superconductivity, a cryogenic cooling medium is usually employed. This cools the current conductor continuously below the transition temperature. For triggering a change to the normally conducting state, temporary heating takes place, or a different one of the above-described mechanisms is employed. Upon deactivation of the heat source or a different one of the transition mechanisms, the current conductor, due to said continuous cooling, "automatically" changes to the superconducting state again ("closing").

In the following, embodiments of the invention will be elucidated in more detail by way of embodiments. In the drawings

FIG. 2$a$ shows a cross-sectional view of a filament wire provided with a sheath;

FIGS. 3$b$ and 4$b$ show a sectional view and a perspective view, respectively, of a schematic arrangement as an alternative to the winding assembly depicted in FIGS. 3$a$ and 4$a$;

DETAILED DESCRIPTION OF PREFERRED EMBODIMENTS

Figure 1:
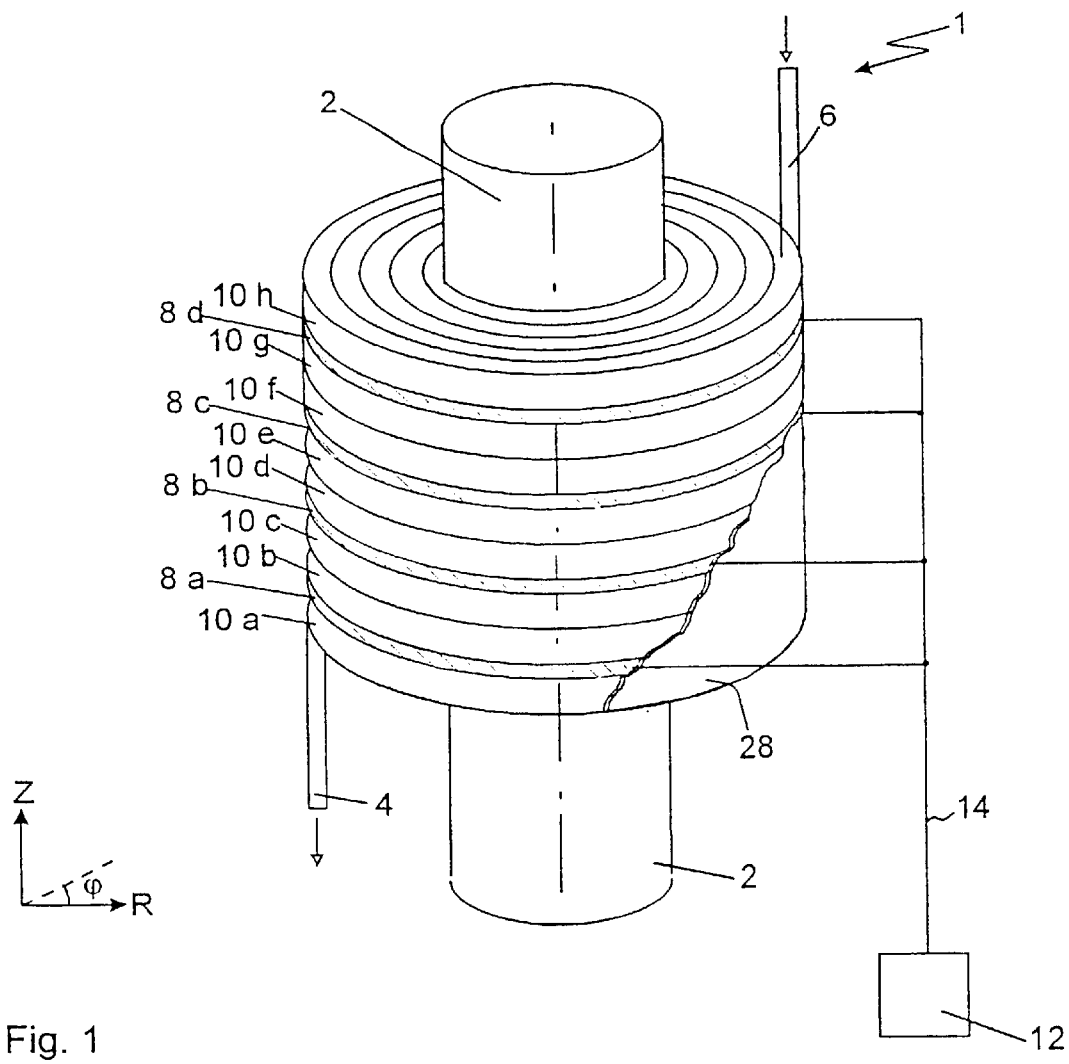
FIG. 1 shows a perspective view of a concrete embodiment of a superconductive high-current switch according to the present invention.

FIG. 1 shows in a perspective view a superconductive high-current switch in the form of a high-current switch unit 1. Several winding layers 10$a$, 10$b$, . . . 10$h$ are lined up adjacent each other in axial direction on an insulating material carrier 2.

FIG. 1 shows in a perspective view a superconductive high-current switch in the form of a high-current switch unit 1. Several winding layers 10$a$, 10$b$ . . . 10$h$ are lined up adjacent each other in an axial direction on an insulating material carrier 2.

Illustrated to the lower left in FIG. 1 is a cylinder coordinate system. The coordinate system contains cylinder axis Z, referred to as winding axis in the following and shown in FIG. 1 in dot and dash line as central axis of carrier 2. In the individual layers 10$a$ . . . 10$h$, there are wound current conductor sections in several winding plies, with the winding ply closest to winding axis Z being referred to as first winding ply herein. The numbering of the winding plies increases with increasing distance R from winding axis Z. The direction of current flow corresponds to cylinder coordinate phi, with the direction of current flow corresponding either to coordinate +phi or –phi.

The high-current switch unit 1 illustrated in FIG. 1 comprises furthermore a plurality of cooling/heating elements 8$a$, 8$b$, 8$c$ and 8$d$ in the form of Peltier elements, which in accordance with the drawings are located between individual winding layers 10$a$, 10$b$; 10$c$, 10$d$; 10$e$, 10$f$ as well as 10$g$, 10$h$, respectively. The heat of the Peltier elements dissipated during cooling is transferred to a heat exchanger in the center of the cylindrical arrangement. The cooling/heating elements 8$a$ to 8$d$ are connected, via a current line 14, to a switching control means 12 which opens and closes the high-current switch unit 1, respectively, by cooling/heating layers 10$a$ . . . 10$h$, in that the current conductor sections in the individual layers 10$a$ . . . 10$h$ are brought to the superconducting state and to the normally conducting state, respectively. The. current to be switched is supplied via an input terminal 6 and discharged via an output terminal 4. Between terminals 4 and 6, there is provided a continuous superconductive current conductor which is constituted by current conductor sections in the individual layers 10$a$ . . . 10$h$. In the normally conducting state, the current conductor between terminals 4 and 6, due to its considerable length, is of high electrical resistance which corresponds to the switching state "open" of high-current switch unit 1.

FIG. 1 shows part of a component insulation means 28. This component insulation means 28 formed of plastics material completely surrounds high-current switch unit 1 and serves both for electrical insulation and for mechanical stabilization. Between the individual layers 10a . . . 10h, there are provided insulation means, and also between the adjacent windings within each layer 10a . . . 10h there is provided an electrical insulation means between the adjacent current conductor sections.

Figure 2:
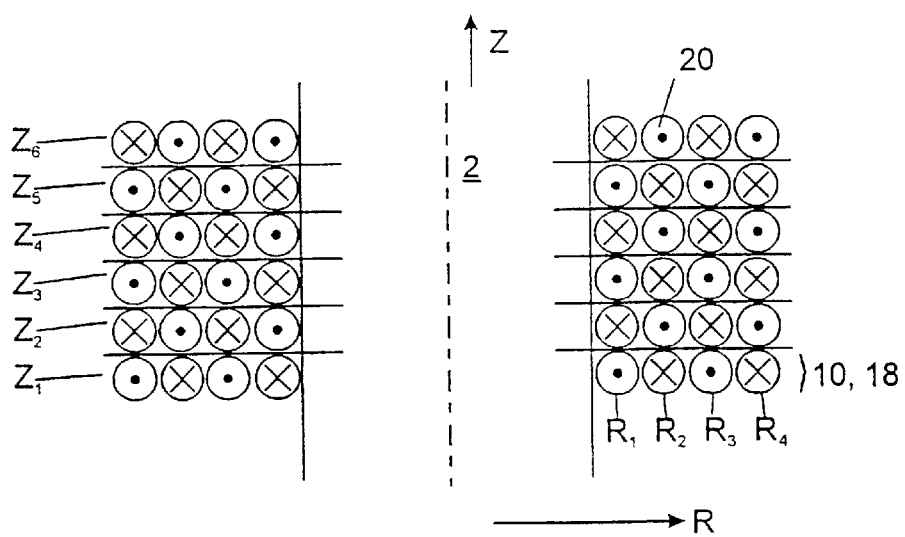
FIG. 2 shows a sectional view corresponding to the longitudinal central plane of a schematically illustrated high-current switch.

FIG. 2 schematically shows six winding layers having four winding plies each. The first winding ply is spaced from winding axis Z of carrier 2 by a radial distance $R_1$, the second winding ply has a radial distance of $R_2$ etc.

The six winding layers depicted schematically in FIG. 2 have a defined axial spacing as indicated by the axial positions $z_1, z_2 \ldots z_6$.

The schematic sectional view. in FIG. 2 points out how the current flows in individual current conductor sections 20 within the individual winding layers and within the individual winding plies. An "x" means a current flowing into the drawing plane, and a "." indicates a current flowing out of the drawing plane. It is thus gatherable from FIG. 2 that current flows in opposite directions through radially adjacent current conductor sections 20 within each individual layer. The same holds also for two current conductor sections within a winding ply that are disposed adjacent each other in axially successive layers. As can be seen, the current flow directions in two adjacent current conductor sections 20 each within the winding ply on radius $R_1$ are opposite to each other. As pointed out at the beginning, this type of current routing forms a low-inductance switch unit, and due to the thus low energy stored in the switch unit, the switching operations are carried out rapidly and with favorable efficiency. As outlined hereinbefore, switching over between superconducting stated (closed switch) and normally conducting state (opened switch) takes place by bringing the current conductor constituted by current conductor sections 20 into the superconducting state and the normally conducting state, respectively, by cooling/heating with the aid of Peltier elements 8 specifically suited for use in the cryogenic temperature range.

In the embodiment shown in FIG. 1, pre-insulated wires of superconductive material are prefabricated in the form of layers and stacked onto cylindrical carrier 2, with the wires being provided with an intermediate layer insulation after formation of each layer. After completion of the winding of all layers, the entire assembly is cast in epoxy resin for further insulation and mechanical stability.

Figure 2A:
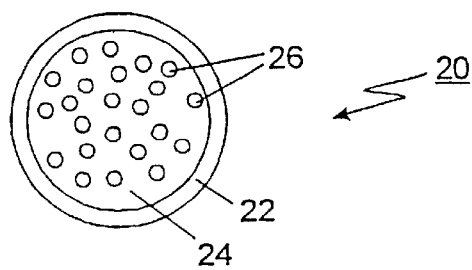

FIG. 2a shows the cross-sectional view of a current conductor section 20. An insulating material sheath 22 encloses a resistance matrix material 24 having wire filaments 26 embedded therein.

In the following, possible geometric shapes of adjacent winding layers shall be elucidated by means of which the current flow pattern depicted schematically in FIG. 1 can be achieved.

Figure 3A:
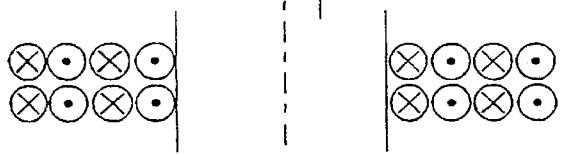
FIGS. 3$a$ and 4$a$ show a sectional view and a perspective view, respectively, of a schematic two-layer winding assembly of a high-current switch according to the invention.

FIG. 3a shows two winding layers having four winding plies each, with the current flow pattern being selected such that radially adjacent current conductor sections within a winding layer conduct the current in opposite directions, whereas two current conductor sections adjacent each other in the direction of the winding axis conduct the current in the same direction.

Figure 4A:
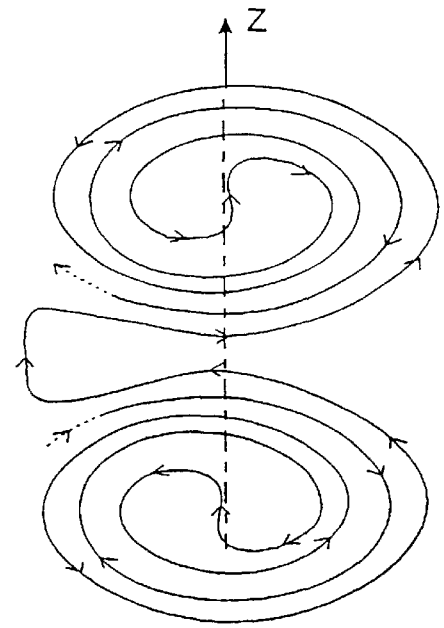

FIG. 4a shows in a schematic perspective view a possible geometric arrangement for a current conductor (FIG. 4a shows the perspective illustration exploded in axial direction (Z)). No reversal of the winding direction takes place here from the upper to the lower winding layer.

Figure 4B:
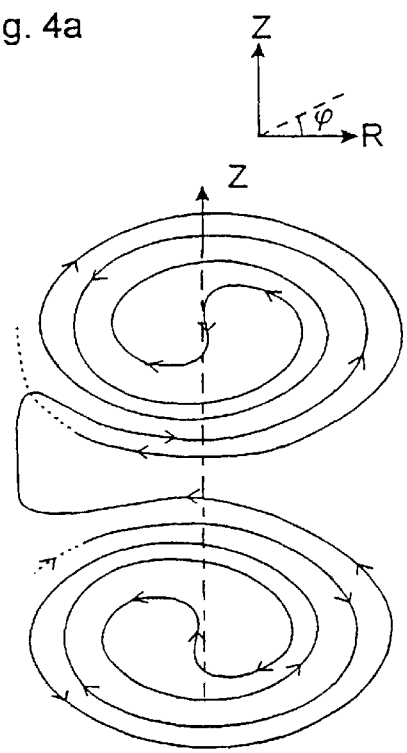

FIGS. 4a and 4b show the construction of the high-current switch from one continuous wire.

Figure 3B:
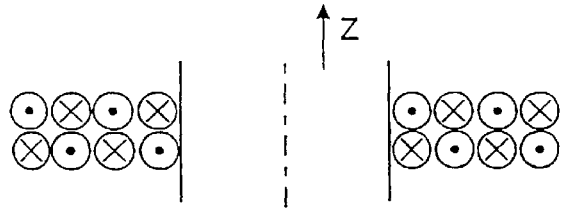

According to FIGS. 3b and 4b, a reversal of the winding direction takes place between adjacent winding layers, so that not only radially adjacent current conductor sections conduct the current in opposite directions, but also current conductor sections adjacent each other in the direction of the winding axis conduct the current in opposite directions.

Figure 5:
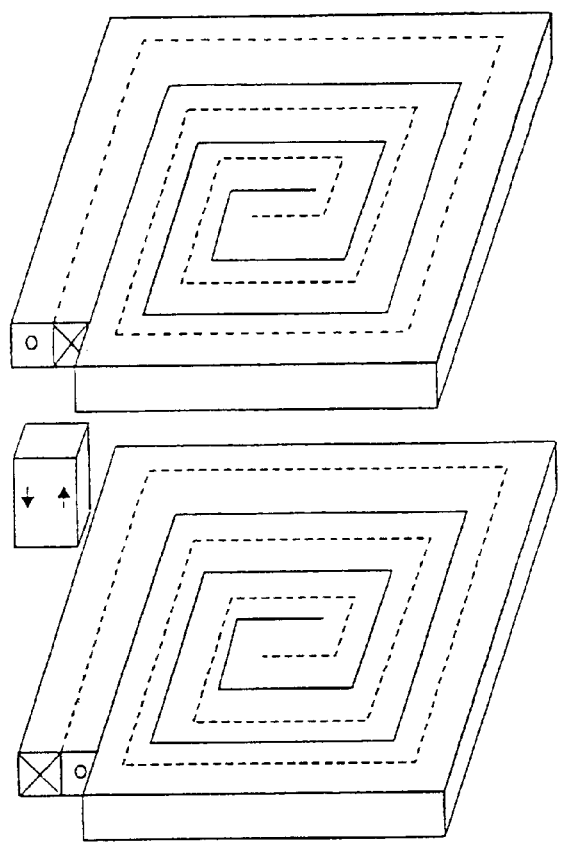
FIG. 5 shows a perspective schematic view of a two-layer winding assembly with, as seen in a ground plan view, rectangular double-wire windings.

FIG. 5 shows an embodiment for winding layers with rectangular outline in the form of a double-conductor winding each. Two axially adjacent winding layers each have a layer transition connection formed integrally with both windings and each depicted in the lower left corner. The current flow directions are indicated in the usual notation. Here too, the currents in radially adjacent and in axially adjacent current conductor sections flow in opposite directions.

The arrangement shown in FIG. 5 can be obtained using rectangular shaped bodies of insulating material into the cavities of which powdery ceramic superconductive material is filled, whereafter the filled shaped body arrangement is sintered. Prior to sintering, a plurality of shaped bodies can be lined up adjacent each other in an axial direction, in order to obtain a complete component after sintering. This component only needs to be provided with external terminals and encapsulating in a casing thereafter.

Figure 6:
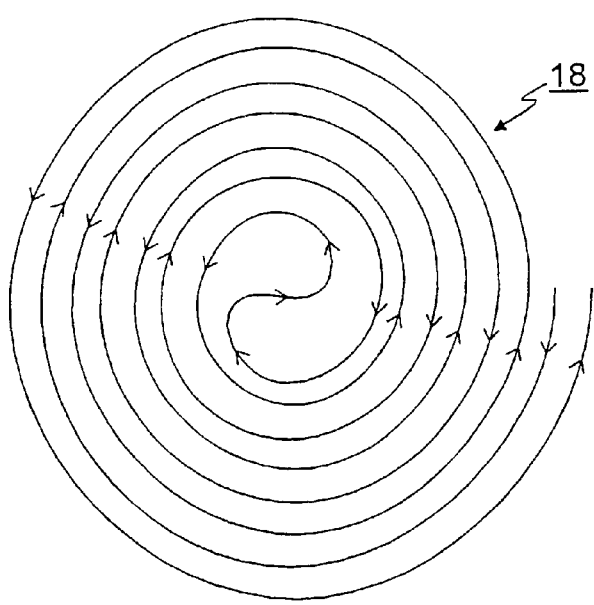
FIG. 6 shows a schematic plan view of a double wire constituting a winding layer of a high-current switch according to the invention.

FIG. 6 schematically shows a winding 18 formed by a double wire, with the double wire being wound from the inside towards the outside. The transition to the adjacent layer then takes place basically in the same manner as indicated in FIG. 5.

Figures 7A, 7B:
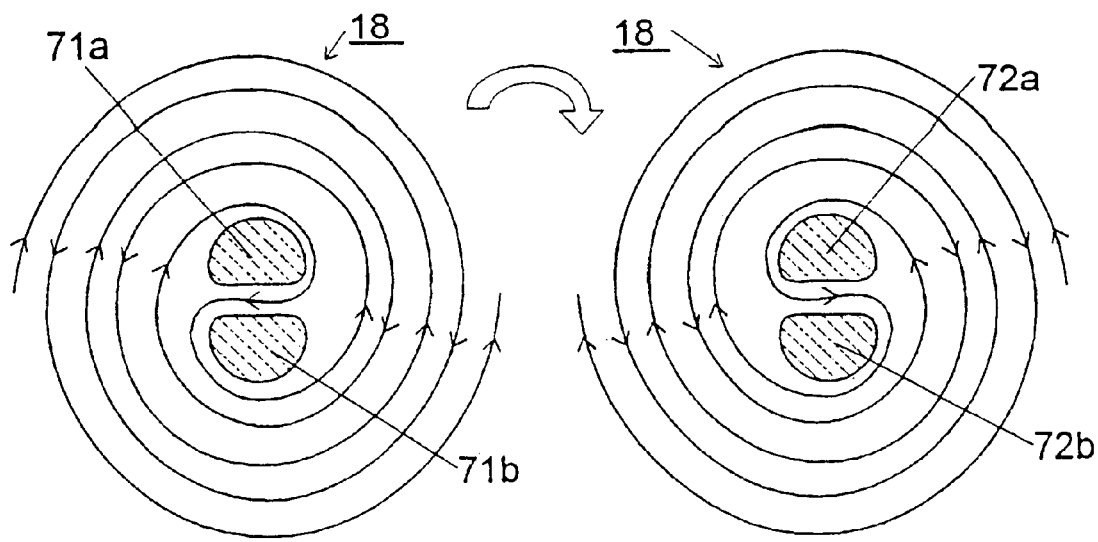
FIGS. 7$a$ and 7$b$ show another embodiment of a winding of a layer and a winding, respectively, obtained by folding over the winding of FIG. 7$a$ to the right.

FIGS. 7a and 7b illustrate a further embodiment of a winding 18'. As can be seen from FIG. 7a, a winding is routed from the outside towards the inside, with this winding being turned around near the winding axis and being then routed towards the outside in the spaces between the winding routed from the outside towards the inside. Just with the winding 18 of FIG. 6, currents in opposite directions are conducted in radially adjacent current conductor sections.

FIG. 7b shows winding 18' of FIG. 7a in a manner rotated towards the right by 180°.

The two windings illustrated in FIGS. 7a and 7b are employed in axially adjacent layers, with the shift in height in the direction of the Z axis taking place on the left-hand and right-hand outsides, respectively, of both windings. As can be seen, a switch unit is obtained by arranging an even number of such winding layers, which has an axially upper and an axially lower terminal on the left-hand or right-hand side of the assembly. The currents are conducted in a manner as depicted schematically in FIG. 2 (checkerboard pattern).

The design of the winding in the region of the center, as shown in FIGS. 6, 7a and 7b, prevents the use of a cylindrical carrier as used in the structure according to FIG. 1. In the present case, two semi-circular carriers (71a, 72a, 71b, 72b) are used allowing the illustrated routing of the winding through the center.

Figure 8:
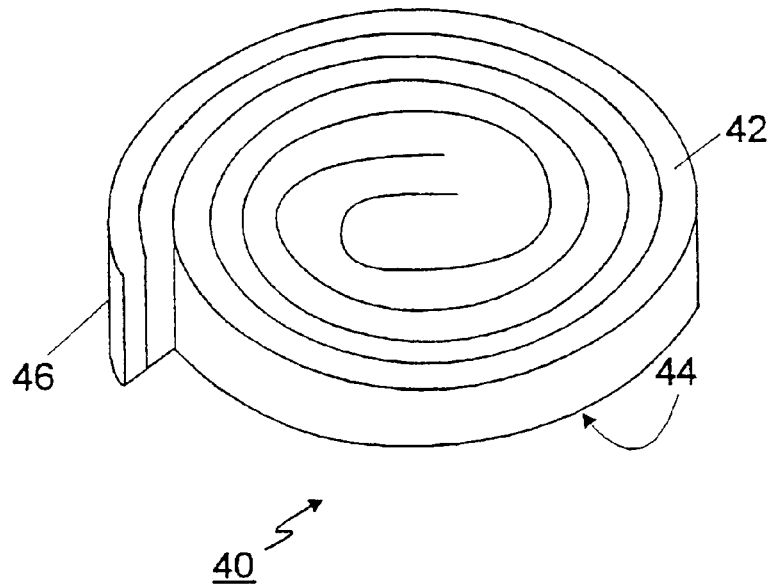
FIG. 8 shows a shaped body constituting structure material for forming a winding means of a layer.

The embodiment shown in FIG. 1 contains windings of windable wire. As an alternative possibility to making the winding layers, so-called structure material may be employed. FIG. 8 shows such structure material in the form of a disc-like shaped body 40 having a bottom 44 in the form of a circular disc and having walls 46 extending spirally in the direction of the radius, with the axial height thereof corresponding to the layer thickness in Z direction through which clearances 42 are formed.

The arrangement shown in FIG. 8 is of schematic nature only. Into clearances 42, powdery superconducting material is filled and then sintered so that a finished winding layer is obtained.

What is claimed is:

1. A superconductive high-current switch, comprising:
   a carrier having a central axis extending longitudinally therethrough;
   a plurality of winding layers, each winding layer including a single winding of current conductor sections that are wound around the carrier in radial succession from the central axis such that the current flow through radially adjacent current conductor sections is in opposite directions;
   the winding layers being distributed axially along the central axis of the carrier such that current flow in axially adjacent current conductor sections with the same radius is in opposite directions; and
   a switching control for changing the current conductor sections between a non-superconducting state and a superconducting state.

2. The high-current switch of claim 1, wherein there are provided at least four layers.

3. The high-current switch of claim 1, wherein the current conductor sections consist of windable wire.

4. The high-current switch of claim 3, wherein the windable wire consists of filament wire with resistance matrix.

5. The high-current switch of claim 3, characterized in that the windable wire consists of a cable of filament wires.

6. The high-current switch of claim 1, wherein the current conductor sections consist of high-temperature superconductive material.

7. The high-current switch of claim 1, wherein a continuous wire is used for the windings.

8. The high-current switch of claim 1, wherein the current conductor sections are pre-insulated.

9. The high-current switch of claim 8, wherein each winding layer is subsequently provided with an insulation layer.

10. The high-current switch of claim 8, wherein an insulation layer surrounds the winding layers.

11. The high-current switch of claim 10, wherein the insulation layer is formed as mechanical stabilization layer.

12. The high-current switch of claim 1, wherein the current conductor sections comprise sheathing material for insulation between the layers.

13. The high-current switch of claim 1, wherein the high-current switch unit comprises a stabilization formed of casting compound.

14. The high-current switch of claim 1, wherein the winding layers consist of preformed structure material with openings defined therein into which the windings are introduced.

15. The high-current switch of claim 14, wherein heat-treated or vapor-deposited ceramic high-temperature superconductive material is provided in the clearances.

16. The high-current switch of claim 14, wherein the structure material is provided as insulation and stabilizing material.

17. The high-current switch of claim 1, wherein the transfer from the superconducting state to the non-superconducting state is effected by a heating means.

18. The high-current switch of claim 17, wherein the heating means is disposed axially between the layers.

19. The high-current switch of claim 17, wherein the heating means connected to the switching control transfers the high-current switch unit only partially from the superconducting to the non-superconducting state, and the complete transfer takes place by self-heating.

20. The high-current switch of claim 17, wherein cooling means are provided between the individual layers.

21. The high-current switch of claim 17, wherein thermoelectric power elements, in particular Peltier elements, are provided for heating and for cooling.

22. The high-current switch of claim 1, wherein the transfer from the superconducting to the non-superconducting state is effected by an externally generated magnetic field.

23. The high-current switch of claim 1, wherein the transfer from the superconducting to the non-superconducting state is effected by a current pulse.

24. The high-current switch of claim 23, wherein the additional current pulse has a duration of less than 10 s.

25. The high-current switch of claim 23, wherein the additional current pulse is caused by a surge of current upon short-circuit.

26. The high current switch of claim 27, wherein the high-current switch unit is designed such that, when it exceeds a threshold value of the rising current, it is transferred automatically from the superconducting to the non-superconducting state.

* * * * *